(12) United States Patent
Chen et al.

(10) Patent No.: US 7,479,426 B2
(45) Date of Patent: Jan. 20, 2009

(54) METHOD OF MANUFACTURING NON-VOLATILE MEMORY CELL

(75) Inventors: Jung-Ching Chen, Tai-Chung Hsien (TW); Chuang-Hsin Chueh, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 195 days.

(21) Appl. No.: 11/463,013

(22) Filed: Aug. 8, 2006

(65) Prior Publication Data

US 2006/0270137 A1 Nov. 30, 2006

Related U.S. Application Data

(62) Division of application No. 10/710,935, filed on Aug. 13, 2004.

(51) Int. Cl.
*H01L 21/336* (2006.01)
(52) U.S. Cl. ...................... 438/257; 257/315

(58) Field of Classification Search ......... 257/315–319, 257/365, E29.129, E29.3, E21.68; 438/257, 438/266
See application file for complete search history.

(56) References Cited

U.S. PATENT DOCUMENTS

| 5,656,840 | A | 8/1997 | Yang |
| 5,716,865 | A | 2/1998 | Ahn |
| 6,207,507 | B1 | 3/2001 | Wang |
| 6,501,124 | B2 | 12/2002 | Kim |
| 2004/0142525 | A1* | 7/2004 | Kim ........................ 438/198 |

* cited by examiner

*Primary Examiner*—David Vu
(74) *Attorney, Agent, or Firm*—Winston Hsu

(57) ABSTRACT

A non-volatile memory cell includes a substrate, a first isolation structure positioned in a first region on the substrate, a second isolation structure surrounding a second region on the substrate, a control gate positioned on the first isolation structure in the first region, a first insulating layer positioned on the control gate, a second insulating layer positioned on the portion of the substrate in the second region, and a floating gate positioned on the first insulating layer and the second insulating layer.

10 Claims, 24 Drawing Sheets

|  | Program | Erase | Read |
|---|---|---|---|
| $V_{CG}$ | >10V | 0V | 2.5~4V |
| $V_D$ | 6V | Float | 1V |
| $V_S$ | 6V | 9~10V | 0V |
| $V_{sub}$ | 0V | 0V | 0V |
| $V_{th}$ | 7~9V (off) | 1~2V (on) | |
| Target speed | 100ms | 1000ms | |

METHOD OF MANUFACTURING NON-VOLATILE MEMORY CELL

CROSS REFERENCE TO RELATED APPLICATIONS

This application is a divisional of application Ser. No. 10/710,935 filed Aug. 13, 2004.

BACKGROUND OF THE INVENTION

1. Field of the Invention

The present invention relates to a non-volatile memory (NVM) cell and a manufacturing method thereof, and more particularly, to an erasable NVM cell and a manufacturing method thereof.

2. Description of the Prior Art

An NVM is a common device for storing data in an integrated circuit, with one of its important characteristics being that the data stored in the NVM will not disappear after power is turned off. Generally speaking, hard disk drives, erasable programmable read-only memory (EPROM), electrically erasable programmable read-only memory (EEPROM), and flash memory can be classified as NVM because data stored in these devices is not lost when power is turned off.

According to the limitation in programming capability, NVM can be divided into multi-time programmable (MTP) memory and one-time programmable (OTP) memory. MTP memory, such as EEPROM or flash memory, is repeatedly programmable to update data, and has specific circuits for erasing, programming, and reading operations. Unlike MTP memory, OTP memory is one-time programmable and has circuits for programming and reading operations without an erasing circuit, so the circuit for controlling the operations of the OTP memory is simpler than the circuit for controlling the operations of the MTP memory. In fact, in order to expand the practical applications of the OTP memory, an erasing method used in EPROM (ultraviolet illumination) is attempted to erase data stored in OTP memory. In addition, a simple circuit is designed to control OTP memory and simulate updateable ability like MTP memory.

Either an MTP memory cell or an OTP memory cell has a stacked structure, which is composed of a floating gate for storing electric charges, a control gate for controlling the charging of the floating gate, and an insulating layer (such as an ONO composite layer composed of an oxide layer, a silicon nitride layer, and an silicon oxide layer) positioned between the floating gate and the control gate. Like a capacitor, the memory cell stores electric charges in the floating gate to get a different threshold voltage $V_{th}$ from the memory cell stores no electric charges in the floating gate, thus storing binary data such as 0 or 1.

Referring to the FIG. 1, FIG. 1 is a cross-sectional diagram of an NVM cell according to the prior art. As shown in FIG. 1, an NVM cell includes a substrate 10, a P-well 12 positioned in the substrate 10, a stacked structure, which is composed of an insulating layer 14, a floating gate 16, an insulating layer 18 and a control gate 20, positioned on the P-well 12, and an N-type doping region 22 positioned in the P-well 12 to surround the stacked structure. The floating gate 16 and the control gate 20 are normally formed of doped polysilicon. The insulating layer 14 positioned beneath the floating gate 16 is functioned as a tunneling oxide layer. The insulating layer 18 positioned between the floating gate 16 and the control gate 20 is an ONO composite layer. In addition, the N-type doping region 22 surrounding the floating gate 16 is functioned as a drain and a source to control the operation of programming, erasing or reading the NVM cell.

U.S. Pat. No. 6,207,507 B1 discloses a multi-level NVM cell to provide higher density memories. Please refer to FIG. 2 of a cross-sectional diagram of a multi-level NVM cell according to the prior art. As shown in FIG. 2, a multi-level NVM cell includes a substrate 30, a P-well 32 positioned in the substrate 30, an insulating layer 34 and an insulating layer 38 positioned on the P-well 32 to insulate three adjacent floating gates 36a, 36b, and 36c from one another. In addition, the multi-level NVM cell further includes an N-type doping region 40, functioning as a source and a drain, positioned in the P-well 32 and on either side of the floating gates 36b and 36c. An insulating layer 42 is formed to cover the three floating gates 36a, 36b, and 36c, and cover the N-type doping region 40. A control gate 44 is formed on the insulating layer 42. Since the multi-level NVM cell has three floating gates 36a, 36b, and 36c, it is capable of storing a 2-bit binary signal, such as 00, 01, 10 or 11.

Normally, the NVM cell uses Fowler Nordheim tunneling technique to erase data from the floating gate. During the operation of erasing the NVM cell, an electric field of the tunneling oxide layer (such as the insulating layer 14 shown in FIG. 1 or the insulating layers 34, 38 shown in FIG. 2) must be at least 10 million volts per centimeter (MV/cm). In order to prevent a high voltage from destructing the elements, the thickness of the tunneling oxide layer is decreased to between 80 and 120 angstroms (Å) to achieve the high electric field. Because of the limitation in the thickness of the tunneling oxide layer and the doping conditions, the manufacturing process of the conventional NVM cell is currently integrated with the manufacturing process of LV MOS transistors (with a gate oxide layer of 70 Å) and is not compatible with that of other higher operation voltage MOS transistors.

SUMMARY OF THE INVENTION

It is therefore an object of the claimed invention to provide a new NVM cell structure and a manufacturing thereof to facilitate the integration of processes for manufacturing an NVM cell with a mixed signal process for manufacturing an HV MOS transistor and an LV MOS transistor.

According to the claimed invention, the NVM cell includes a substrate, a first isolation structure positioned in a first region on the substrate, a second isolation structure surrounding a second region on the substrate, a control gate positioned on the first isolation structure in the first region, a first insulating layer positioned on the control gate, a second insulating layer positioned on the portion of the substrate in the second region, and a floating gate positioned on the first insulating layer and the second insulating layer.

It is an advantage of the present invention that the floating gate is positioned above the control gate, so that the control gate is complete followed by combining the manufacturing processes for forming the tunneling oxide layer, the floating gate and the source/drain of the NVM cell together with the mixed signal process to facilitate simplification and condition control in the manufacturing processes. In addition, the control gate is positioned on the isolation structure to reduce the substrate leakage currents while operating the NVM cell.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 24 lists parameter values suggested to program, erase or read an NVM cell according to the present invention.

DETAILED DESCRIPTION

Figure 1:
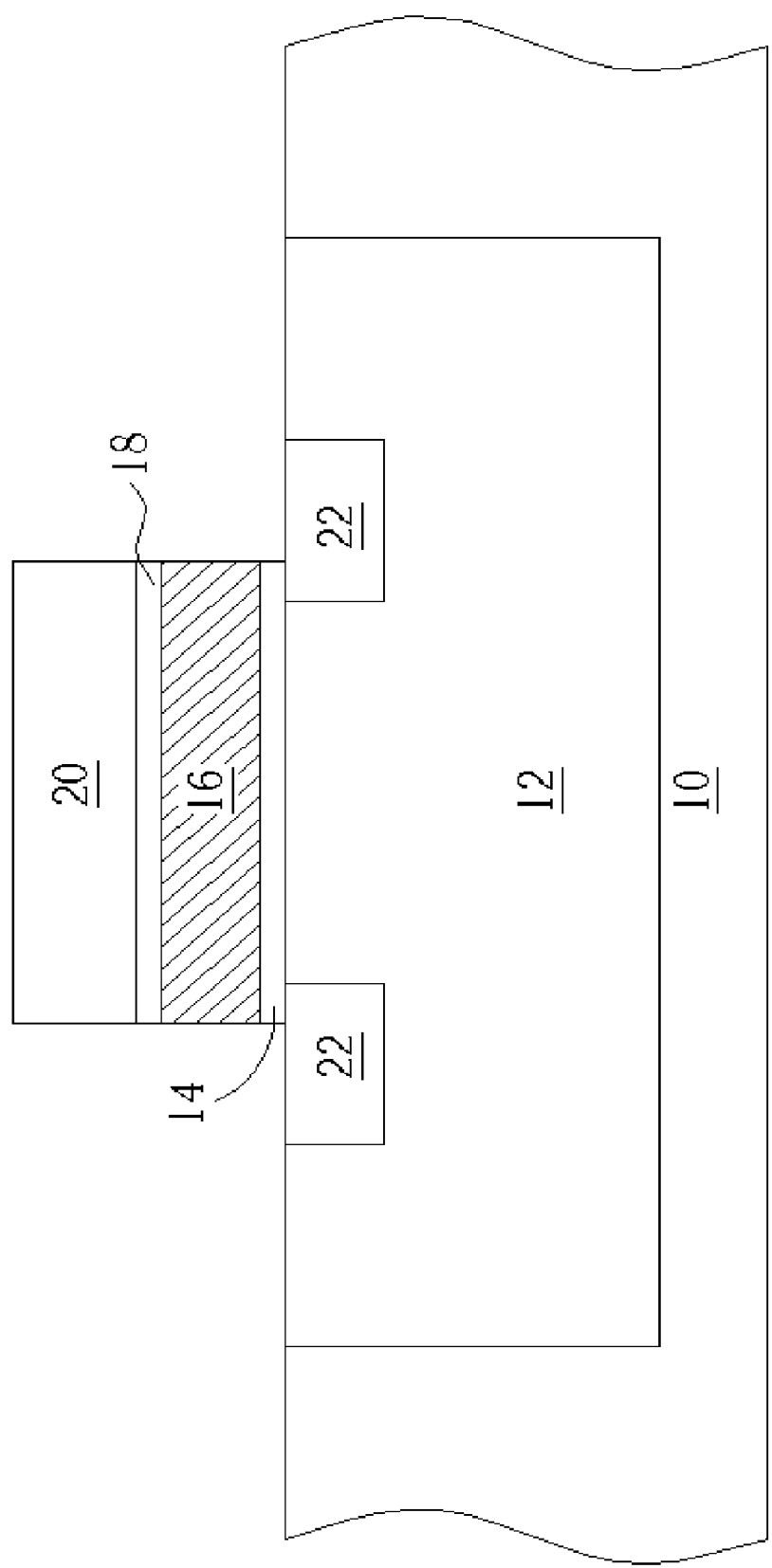
FIG. 1 is a cross-sectional diagram of an NVM cell according to the prior art.
Figure 2:
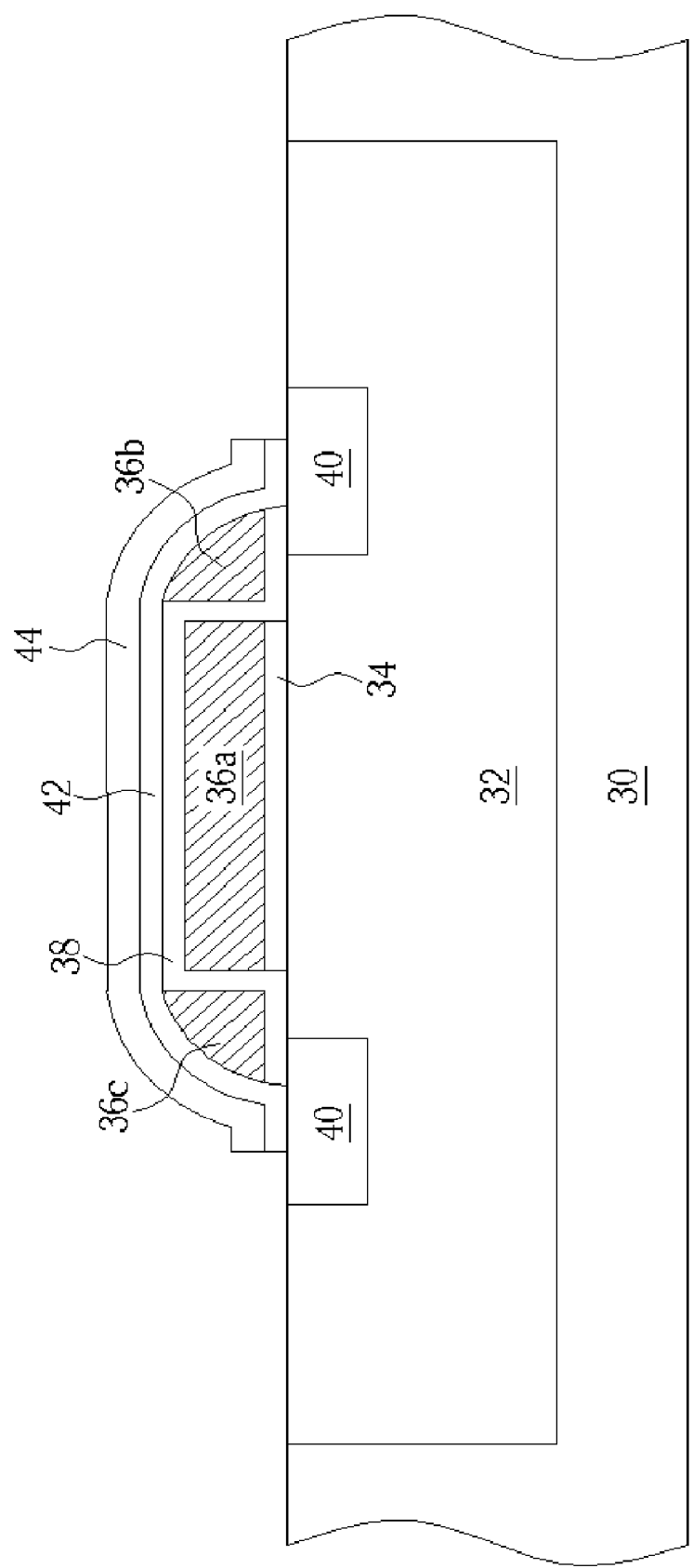
FIG. 2 is a cross-sectional diagram of a multi-level NVM cell according to the prior art.
Figure 3:
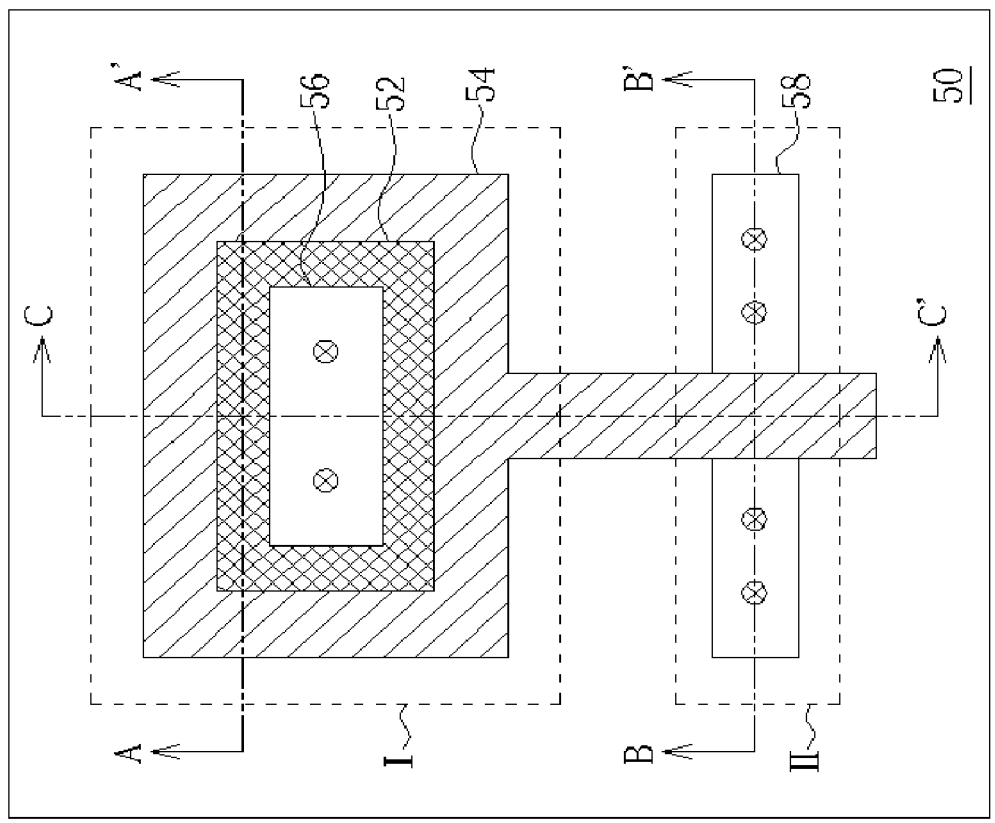
FIG. 3 is a top view of an NVM cell according to the present invention.

Referring to FIG. 3, FIG. 3 is a top view of an NVM cell according to the present invention. As shown in FIG. 3, an NVM cell includes a first region I and a second region II defined on a substrate 50. The first region I is provided for forming a stacked structure composed of a control gate 52 and a floating gate 54. The floating gate 54 is formed above the control gate 52 and includes an opening 56 therein to expose a portion of the control gate 52. The opening 56 is provided for forming a wire to connect to the control gate 52. The second region II is provided for forming the floating gate 54 above an N-type doping region 58, which functions as a source and a drain.

Figure 4:
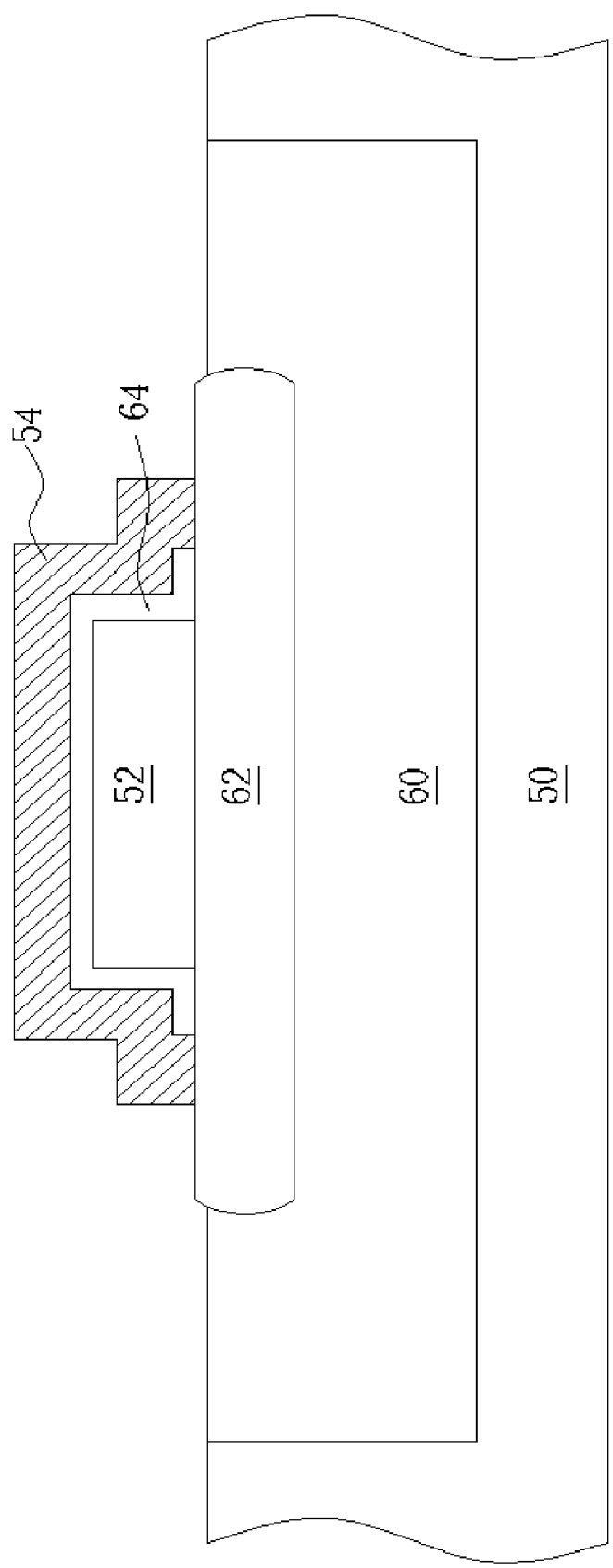
FIG. 4 is a cross-sectional diagram of the NVM cell shown in FIG. 3 along a line A-A'.
Figure 5:
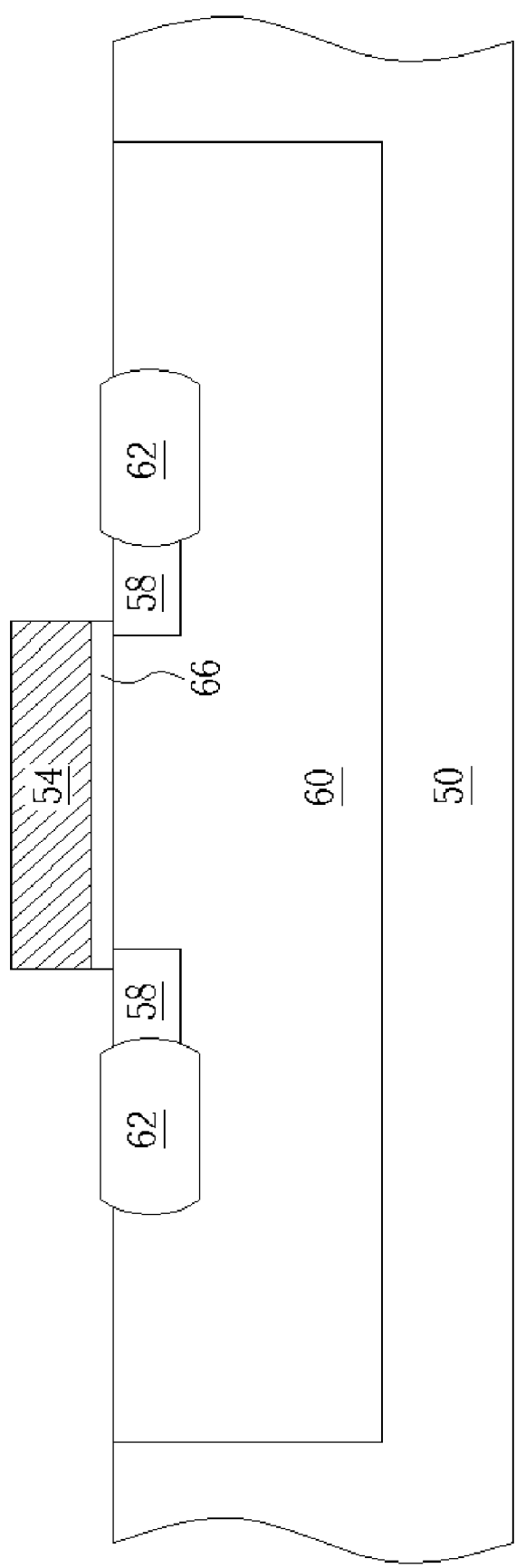
FIG. 5 is a cross-sectional diagram of the NVM cell shown in FIG. 3 along a line B-B'.
Figure 6:
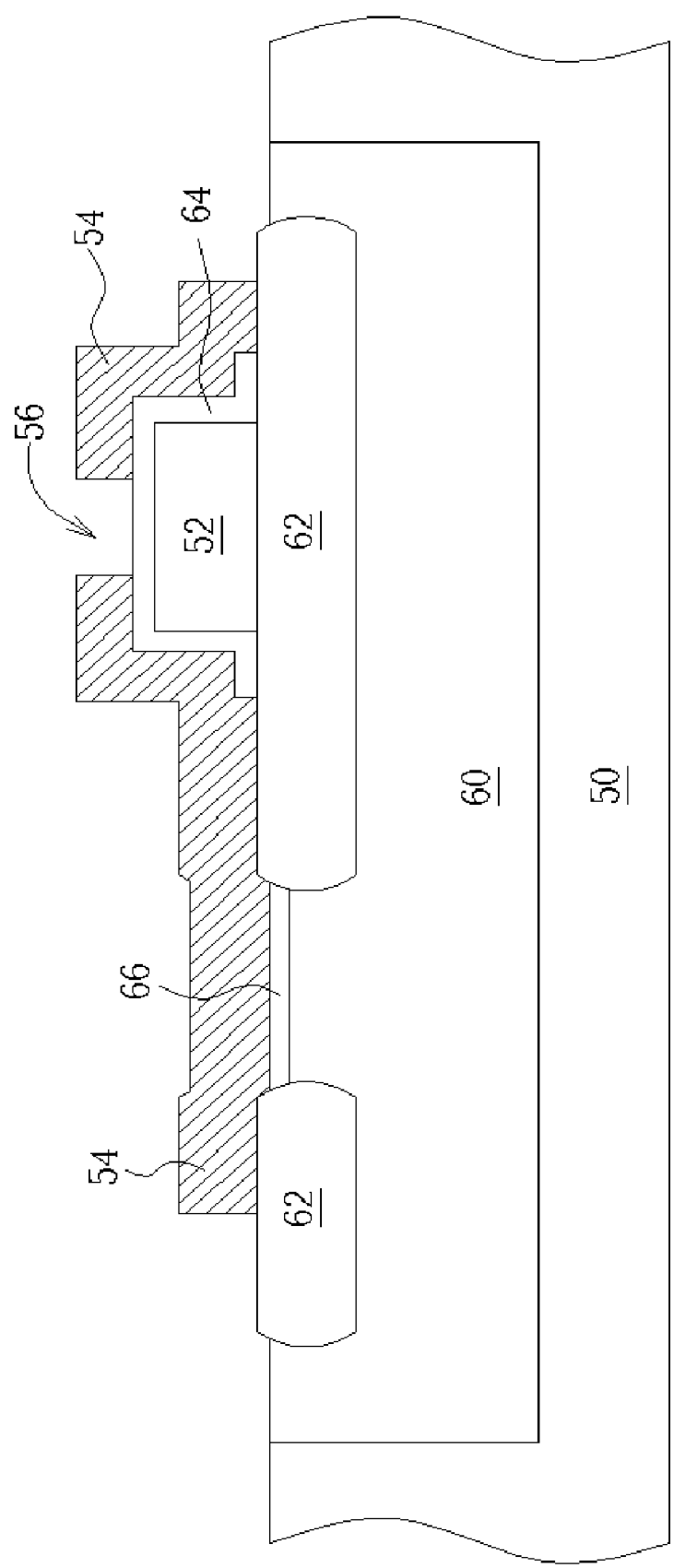
FIG. 6 is a cross-sectional diagram of the NVM cell shown in FIG. 3 along a line C-C'.

It is appreciated to refer to FIGS. 4-6 to realize the NVM cell structure. FIG. 4 is a cross-sectional diagram of the NVM cell shown in FIG. 3 along a line A-A', FIG. 5 is a cross-sectional diagram of the NVM cell shown in FIG. 3 along a line B-B', and FIG. 6 is a cross-sectional diagram of the NVM cell shown in FIG. 3 along a line C-C'. As shown in FIG. 4, the portion of the NVM cell in the first region I includes a P-well 60 positioned in the substrate 50, an isolation structure 62 positioned on the P-well 60, and a stacked structure, which is composed of the control gate 52, an insulating layer 64, and the floating gate 54, positioned atop the isolation structure 62. In a better embodiment of the present invention, the substrate 50 is a P-type silicon substrate, the insulating layer 64 is an ONO (oxide/nitride/oxide) composite layer, the floating gate 54 and the control gate 52 are formed of doped polysilicon or other conductive materials, and the isolation structure 62 is either a field oxide layer or a shallow trench isolation structure. Alternatively, the substrate 50, the P-well 60 and the N-type doping region 58 can be formed into different conductive types, depending on the circuit design to the NVM cell. Optionally, a deep N-well is formed to provide a guard ring surrounding the NVM cell. In addition, the insulating layer 64 can be formed of any materials endurable to high-voltage operations.

As shown in FIG. 5, the portion of the NVM cell in the second region II includes an insulating layer 66 positioned between the floating gate 54 and the P-well 60, the N-type doping region 58 positioned in the P-well 60 and adjacent to the floating gate 54, and a plurality of isolation structures 62 positioned on the P-well 60 to surround the N-type doping region 58. The insulating layer 66 is used as a tunneling oxide layer, and a preferred thickness of the insulating layer 66 is approximately between 90~120 Å. The N-type doping region 58 provides a source and a drain of the NVM cell, and defines a channel region beneath the floating gate 54.

As shown in FIG. 6, the floating gate 54 of the NVM cell covers the insulating layer 64 in the first region I and the insulating layer 66 in the second region II. The channel region is defined beneath the floating gate 54 and surrounded by the isolation structures 62.

Referring to FIG. 24, FIG. 24 lists parameter values suggested to program, erase or read an NVM cell according to the present invention. As shown in FIG. 24, when performing a program operation, a high voltage is supplied to the control gate 52 ($V_{CG}$>10V), a positive voltage is supplied to the drain 58 ($V_D$=6V), and the source 58 and the substrate 50 are grounded ($V_S$=$V_{sub}$=0). As a result, electrons are injected into the floating gate 54 to change the threshold voltage $V_{th}$ thereof to 7~9 volts. When performing an erase operation, a high voltage is supplied to the source 58 ($V_s$=9~10V), the control gate 52 and the substrate 50 are grounded ($V_{CG}$=$V_{sub}$=0), and the drain 58 is set in a floating condition, such that electrons are removed from the floating gate 54 to change the threshold voltage $V_{th}$ thereof to the original value of about 1~2 volts. When performing a read operation, a voltage ranging between the original threshold voltage (1~2V) and the programmed threshold voltage (7~9V), for example 2.5~4V, is supplied to the control gate 52, a positive voltage is supplied to the drain 58 ($V_D$=1V), and the source 58 and the substrate 50 are grounded ($V_S$=$V_{sub}$=0).

Figure 7:
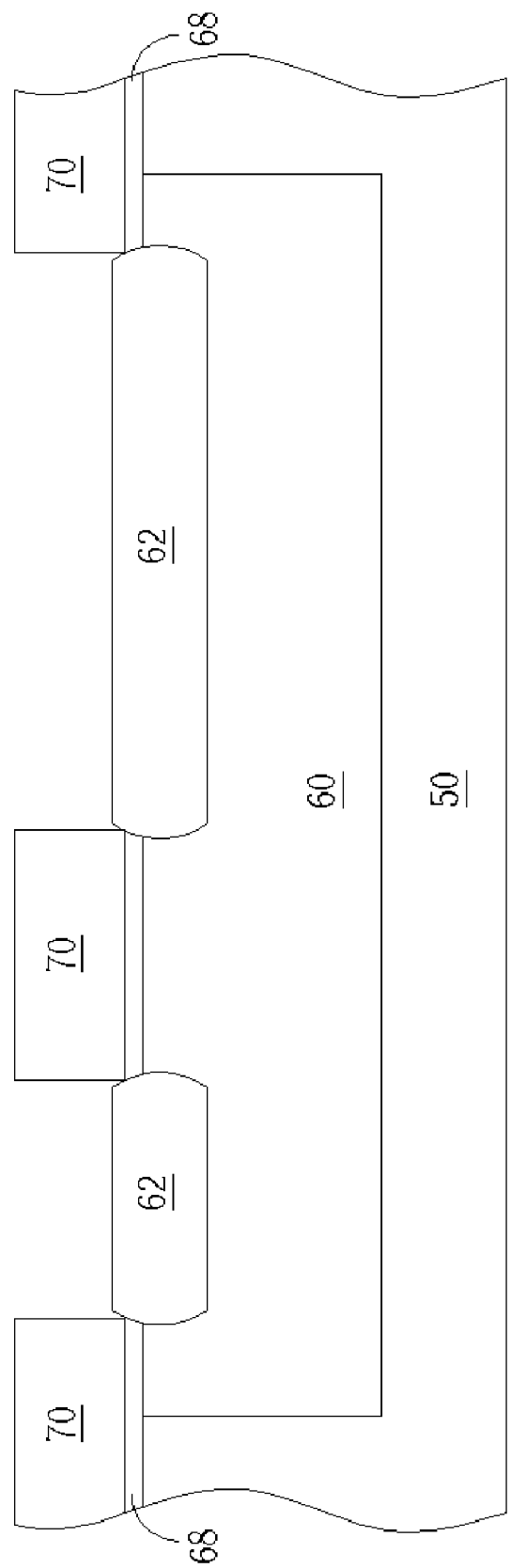
FIGS. 7-10 are schematic diagrams of a method of manufacturing an NVM cell according to the present invention.

Please refer to FIGS. 7-10. FIGS. 7-10 are schematic diagrams of a method of manufacturing an NVM cell according to the present invention. As shown in FIG. 7, a substrate 50, such as a P-type silicon substrate, is provided. A doping process is performed to form a P-well 60 in the substrate 50. Following that, an insulating layer 68 and a mask 70 are formed on the substrate 50, respectively. For example, the insulating layer 68 is a pad oxide layer, and the mask 70 is a silicon nitride layer. A photolithographic and etching process is then performed to define the patterns of the mask 70 to expose the portion of the insulating layer 68 for forming isolation structures. Subsequently, a thermal oxidation method is used to diffuse moisture and oxygen into the insulating layer 68 and the P-well 60, so as to form the isolation structures 62 and drive-in the P-well 60. Following the steps described above, the isolation structures 62 are formed as field oxide layers. Alternatively, the isolation structures 62 can be formed as shallow trench isolation structures using conventional processes.

Figure 8:
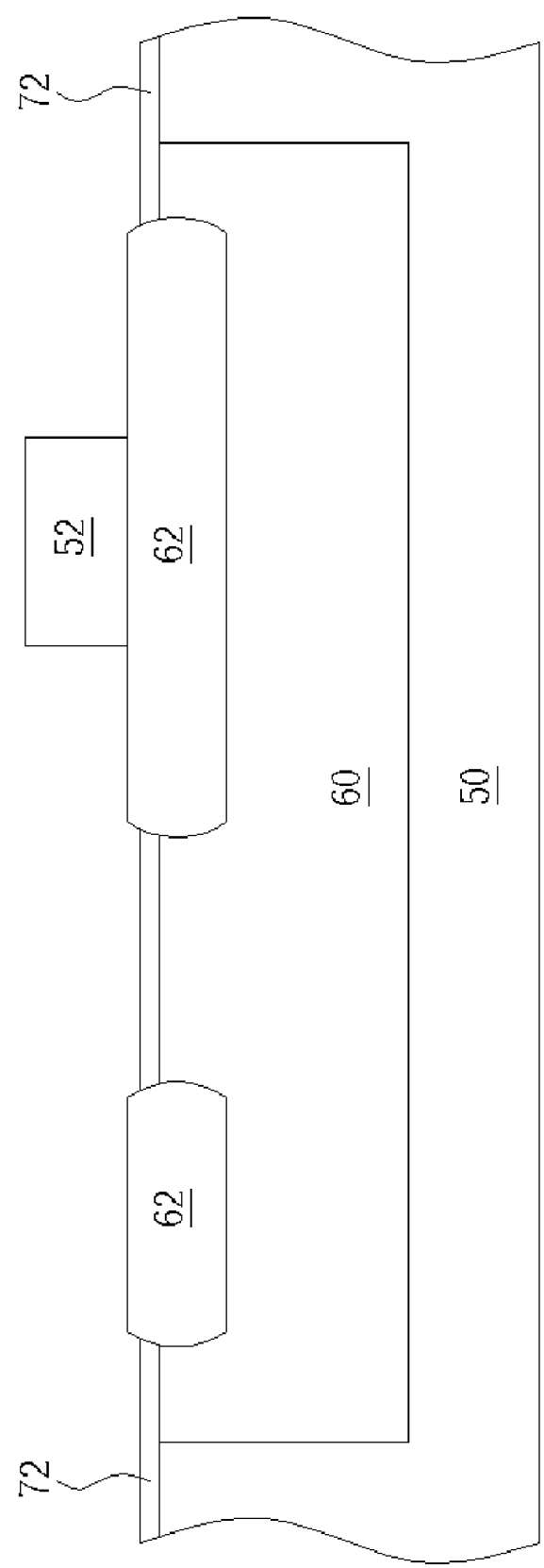

As shown in FIG. 8, the mask 70 and the insulating layer 68 are removed, and another insulating layer 72, such as a sacrificial oxide layer, is formed on the substrate 50. A preferred thickness of the insulating layer 72 is approximately between 300~500 Å. Following that, a doped polysilicon layer (not shown) is deposited on the substrate 50. Using the insulating layer 72 as an etching stop layer, a photolithographic and etching process is performed to remove portions of the doped polysilicon layer and define the patterns of a control gate 52 as well.

Figure 9:
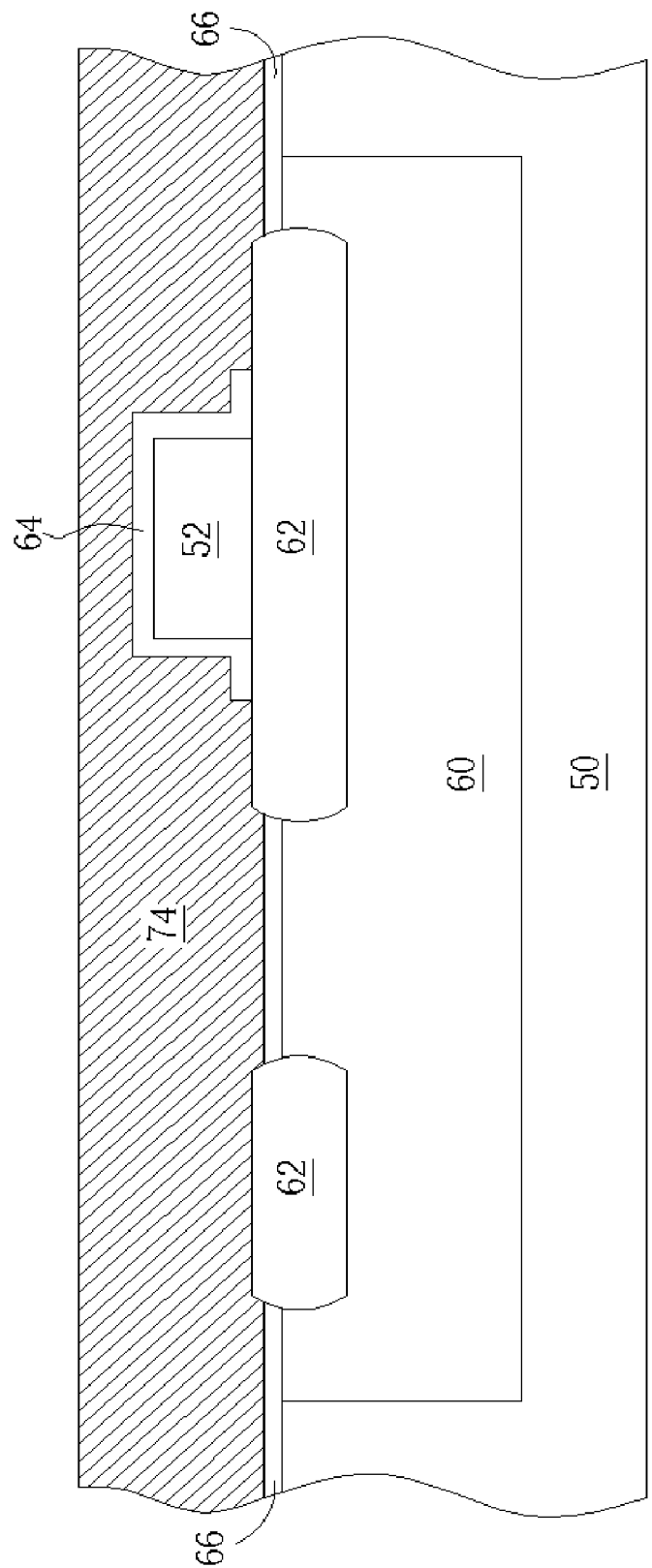

As shown in FIG. 9, an insulating layer 64 is formed on the control gate 52. In a better embodiment of the present invention, the insulating layer 64 is an ONO composite layer formed following the steps of: performing a thermal oxidation process to form an oxide layer with a thickness of 50~150 Å as a bottom oxide layer on the substrate 50; performing a low-pressure chemical vapor deposition (LPCVD) to deposit a silicon nitride layer with a thickness of 200~350 Å on the bottom oxide layer; performing an annealing process under a high temperature of 950° C. for a duration of 30 minutes to repair the structure of the silicon nitride layer, and simultaneously, introducing water steam to perform a wet oxidation process to form a silicon oxide layer with a thickness of 50~70 Å as a top oxide layer; and performing a photolithographic and etching process to define the patterns of the insulating layer 64.

Figure 10:
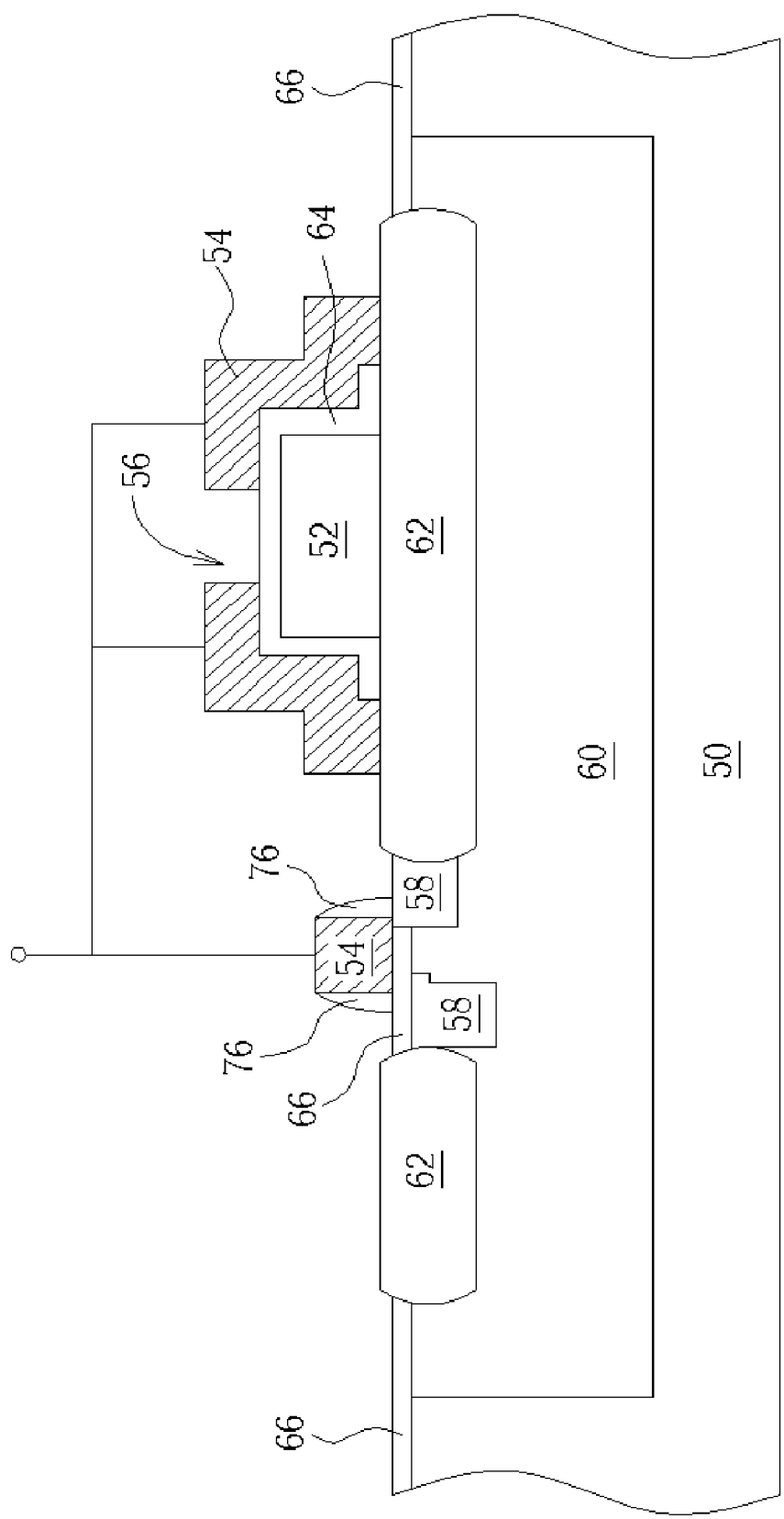

After removal of the insulating layer 72, still referring to FIG. 9, another insulating layer 66, functioning as a tunneling oxide layer, and a doped polysilicon layer 74 are formed on the entire substrate 50. As shown in FIG. 10, a photolithographic and etching process is then performed to remove portions of the doped polysilicon layer 74 and define the patterns of a floating gate 54, as is also shown in FIG. 3. Following that, a spacer 76 is formed on either side of the floating gate 54, and a doping process is used to form an N-type doping region 58, functioning as a source and a drain, in the P-well 60 and adjacent to the floating gate 54, thus completing the fabrication of the NVM cell.

Figure 11:
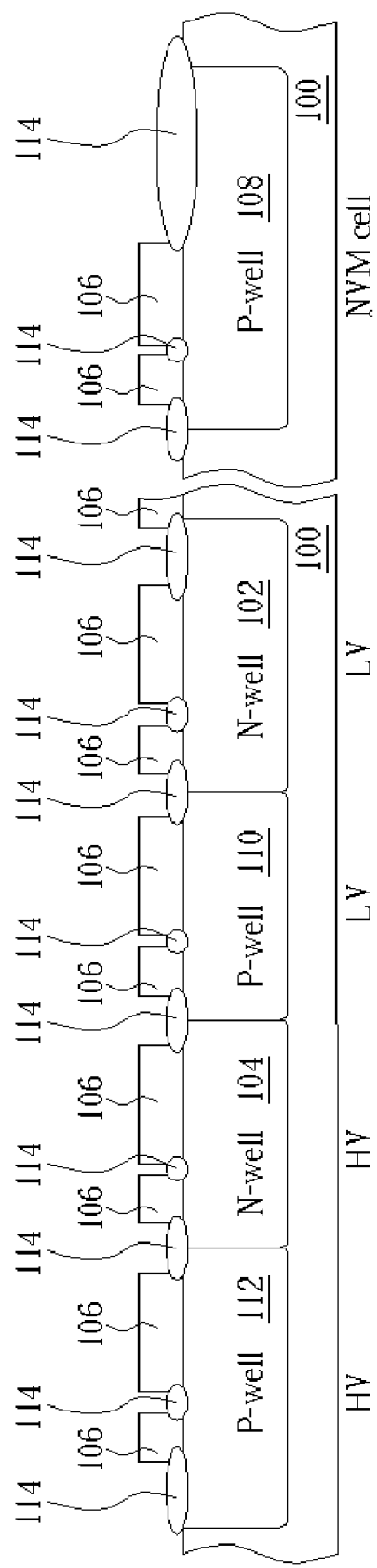
FIGS. 11-20 are schematic diagrams of a method of integrating processes for manufacturing an NVM cell with a mixed signal process for manufacturing an HV MOS transistor and an LV MOS transistor according to the present invention.

Referring to FIGS. 11-20, FIGS. 11-20 are schematic diagrams of a method of integrating processes for manufacturing an NVM cell with a mixed signal process for manufacturing an HV MOS transistor and an LV MOS transistor according to the present invention. As shown in FIG. 11, a substrate 100, such as a P-type silicon substrate, includes an NVM cell region for forming an NVM cell, a high-voltage region HV for forming an HV MOS transistor, and a low-voltage region LV for forming an LV MOS transistor. The method forms a pad oxide layer (not shown) on the substrate 100 followed by performing a blanket implantation process to form an N-well 102 in the LV region, an N-well 104 in the HV region, and an N-well (not shown) in the NVM cell region. Subsequently, a silicon nitride layer 106 with a thickness of approximate 1000 Å is deposited on the substrate 100 and then etched back to form a plurality of openings therein, so as to define regions for forming isolation structures (and define active regions). A doping process is then performed using P-type dopants to form a P-well 108 in the NVM cell region, a P-well 110 in the LV region, and a P-well 112 in the HV region. Using the silicon nitride layer 106 as a mask, a thermal oxidation process is performed to form a plurality of isolation structures 114 and drive-in the N-well 102, 104, and the P-well 108, 110, and 112 as well. In a better embodiment of the present invention, a thickness of the isolation structures 114 is approximate 4000~6000 Å. The isolation structures 114 are either formed as field oxide layers following the steps described above, or formed as shallow trench isolation structures using conventional processes.

Figure 12:
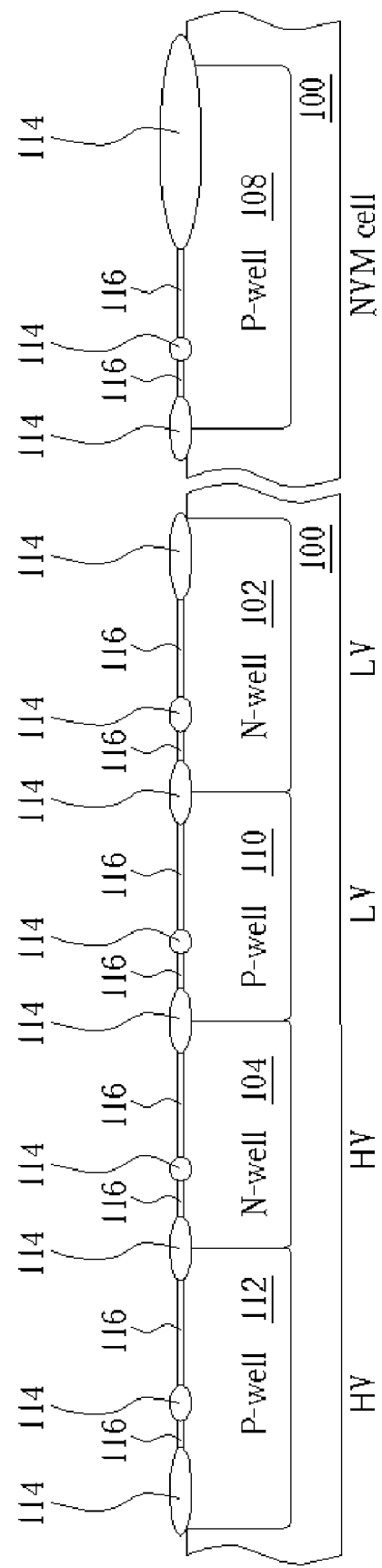
Figure 13:
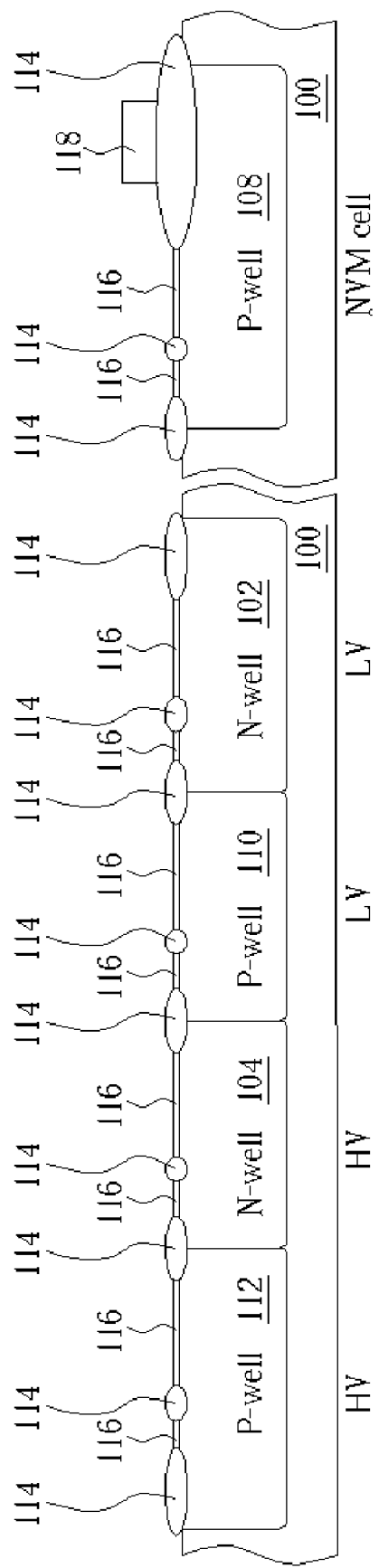

As shown in FIG. 12, the mask 106 is removed, and another insulating layer 116, such as a sacrificial oxide layer, is formed on the substrate 100. A preferred thickness of the insulating layer 116 is approximately between 300~500 Å. Following that, a doped polysilicon layer (not shown) is deposited on the substrate 100. Using the insulating layer 116 as an etching stop layer, a photolithographic and etching process is performed to remove portions of the doped polysilicon layer in the HV region, the LV region and the NVM cell region, and define the patterns of a control gate 118 on the isolation structure 114 with the residual of the doped polysilicon layer in the NVM cell, as shown in FIG. 13.

Figure 14:
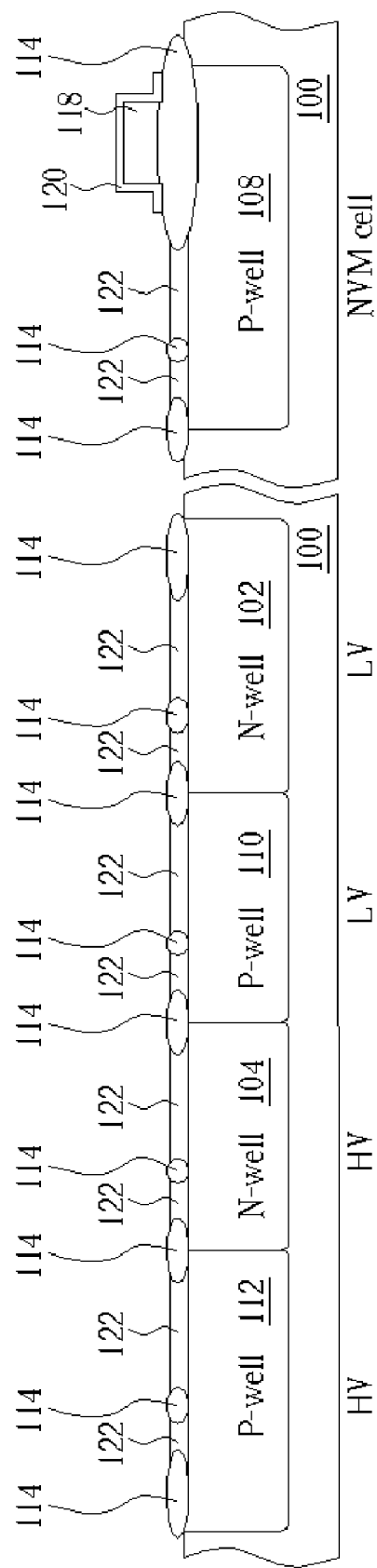

As shown in FIG. 14, an insulating layer 120 is formed on the control gate 118. In a better embodiment of the present invention, the insulating layer 120 is an ONO composite layer formed following the steps of: performing a thermal oxidation process to form an oxide layer with a thickness of 50~150 Å as a bottom oxide layer on the substrate 100; performing an LPCVD method to deposit a silicon nitride layer with a thickness of 200~350 Å on the bottom oxide layer; performing an annealing process under a high temperature of 950° C. for a duration of 30 minutes to repair the structure of the silicon nitride layer, and simultaneously, introducing water steam to perform a wet oxidation process to form a silicon oxide layer with a thickness of 50~70 Å as a top oxide layer; and performing a photolithographic and etching process to define the patterns of the insulating layer 120.

Figure 15:
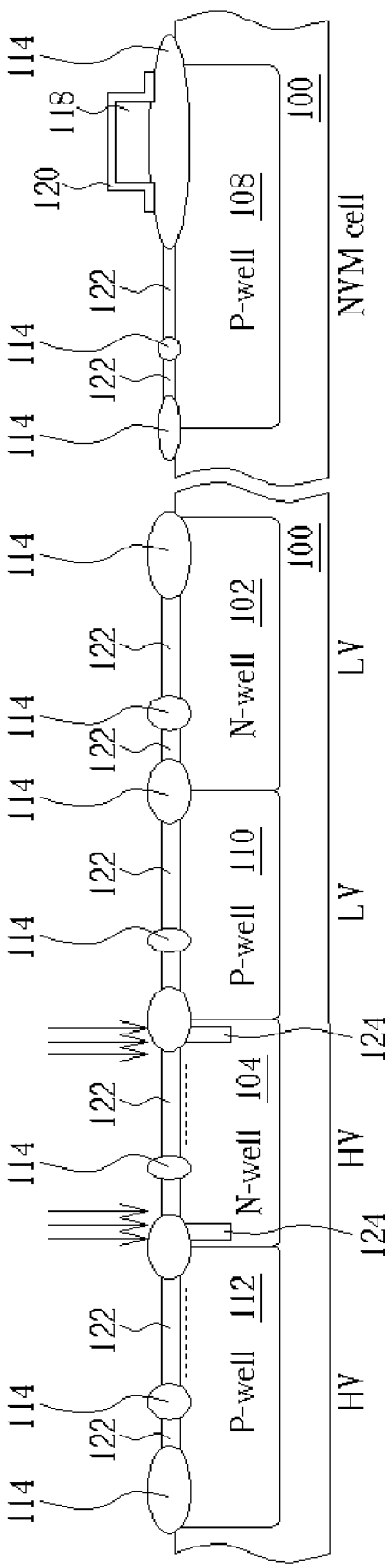

After removal of the insulating layer 116, still referring to FIG. 14, an insulating layer 122, which forms a gate oxide layer of an HV MOS transistor, is formed on the silicon substrate 100. A preferred thickness of the insulating layer 122 is approximate 300~500 Å. As shown in FIG. 15, a doping process is performed in the HV region. For example, a channel stop region 124 and/or a guard ring are formed beneath the isolation structure 114 and adjacent to the edge of the N-well 104; the P-well 112 is doped to adjust a threshold voltage of an NMOS transistor and/or form an anti-punch through (APT) region in the P-well 112; and the N-well 104 is doped to adjust a threshold voltage of a PMOS transistor.

Figure 16:
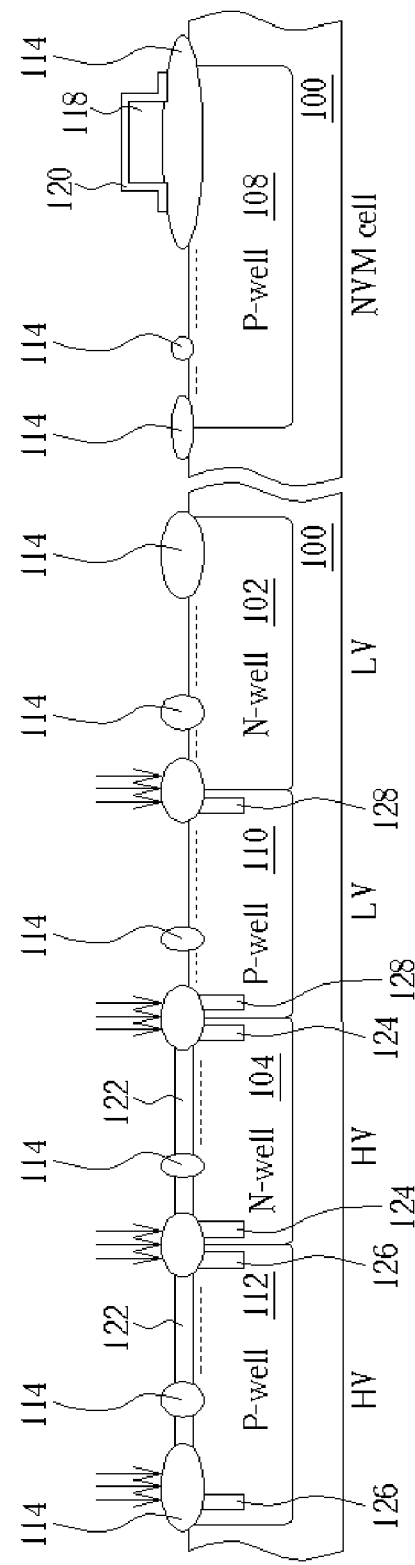

As shown in FIG. 16, another doping process is performed in the P-wells 112, 110 and 108. For example, in the HV region, a channel stop region 126 and/or a guard ring are formed beneath the isolation structure 114 and adjacent to the edge of the P-well 112; in the LV region, a channel stop region 128 and/or an anti-punch through region are formed in the P-well 110; and in the NVM cell region, a channel stop region and/or an anti-punch through region are formed in the P-well 108. In addition, a doping process is performed to adjust threshold voltages in the LV region and the NVM cell region. Following that, portions of the insulating layer 122 in the LV region and the NVM cell region is removed to expose the substrate 100 in the LV region and the NVM cell region.

Figure 17:
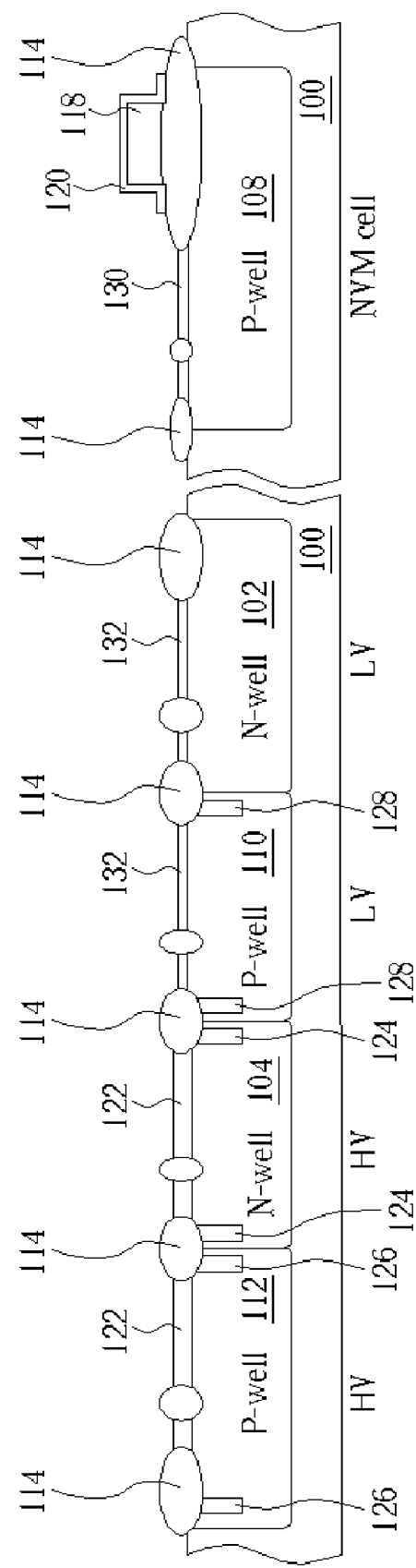

As shown in FIG. 17, a thermal oxidation or an LPCVD process is subsequently used to form an insulating layer 130, such as an oxide layer, on the entire substrate 100. A preferred thickness of the insulating layer 130 is approximate 50~70 Å. A portion of the insulating layer 130 in the LV region is then removed to expose the substrate 100 in the LV region. Another insulating layer 132 with a preferred thickness of 60~70 Å is formed on the entire substrate 100. So far, the insulating layer 132 in the LV region has a thickness of 60~70 Å, and is used as a gate oxide layer of an LV MOS transistor. The insulating layer 130 in the NVM cell region has an accumulated thickness of 95~100 Å, and is used as a tunneling oxide layer of an NVM cell. The insulating layer 122 in the HV region has an accumulated thickness of 450~550 Å, and is used as a gate oxide layer of an HV MOS transistor.

Figure 18:
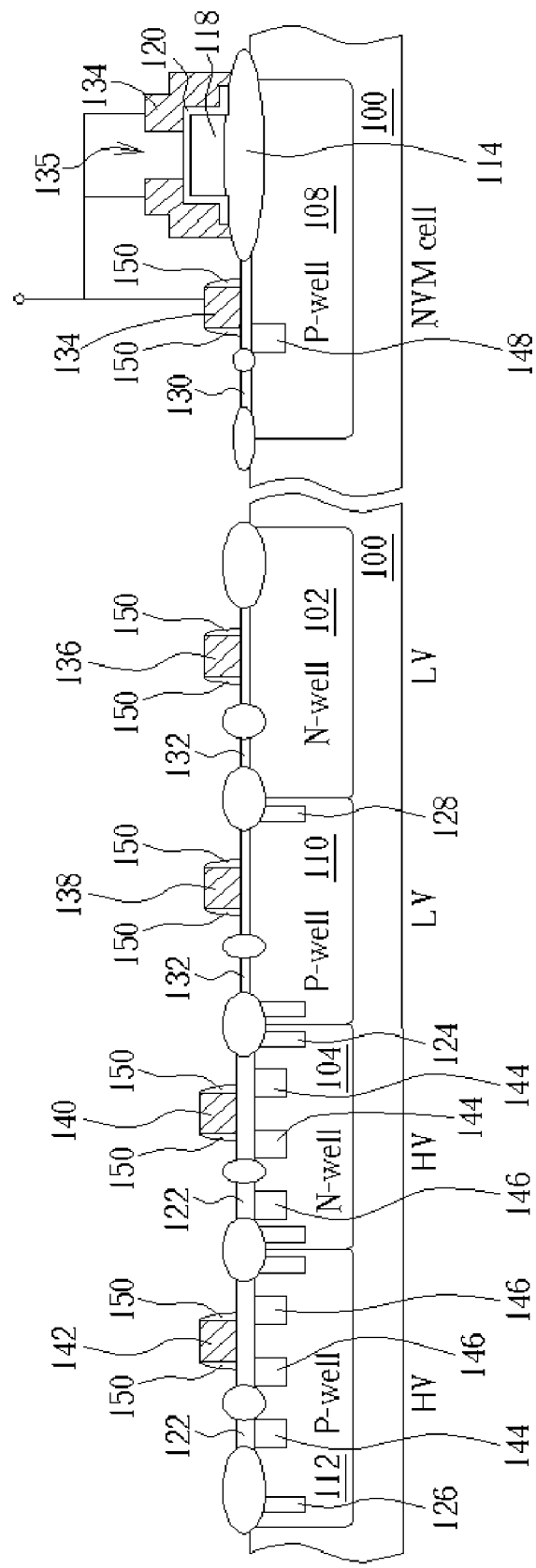

As shown in FIG. 18, a doped polysilicon layer is deposited on the entire substrate 100 followed by using a photolithographic and etching process to remove portions of the doped polysilicon layer, thus defining the patterns of a floating gate 134 in the NVM cell region, a plurality of gates 136 and 138 in the LV region, and a plurality of gates 140 and 142 in the HV region. In addition, a silicide layer, such as WSi$_x$, is optionally formed on the doped polysilicon layer, so as to reduce sheet resistance of the gates. In a better embodiment of the present invention, the floating gate 1 34 covers the insulating layers 120, 130, and has an opening 135 for forming a wire to connect to the control gate 118 and control the operation of the NVM cell.

Still referring to FIG. 18, a doping process is then performed in the HV region, so as to form a P-type grade region 144 in the N-well 104 adjacent to the gate 140, and the P-type grade region 144 is a double diffused drain (DDD) of a PMOS transistor. In addition, an N-type grade region 146 is formed in the P-well 112 adjacent to the gate 142, and the N-type grade region 146 is a double diffused drain of an NMOS transistor. Furthermore, at least a P-type grade region 144 is formed in the P-well 112 and at least an N-type grade region 146 is formed in the N-well 104, so as to improve the dopant concentration distribution in both of the P-well 112 and the N-well 104. Furthermore, during the doping process in the HV region, an N-type grade region 148 is formed in the P-well 108 of the NVM cell region (at the drain side), so as to increase the breakdown voltage of the source side. Subsequently, a silicon oxide layer is deposited on the substrate 100 followed by etching a portion of the silicon oxide layer, so as to form a spacer 150 on either side of the floating gate 134 and the gates 136, 138, 140 and 142.

Figure 19:
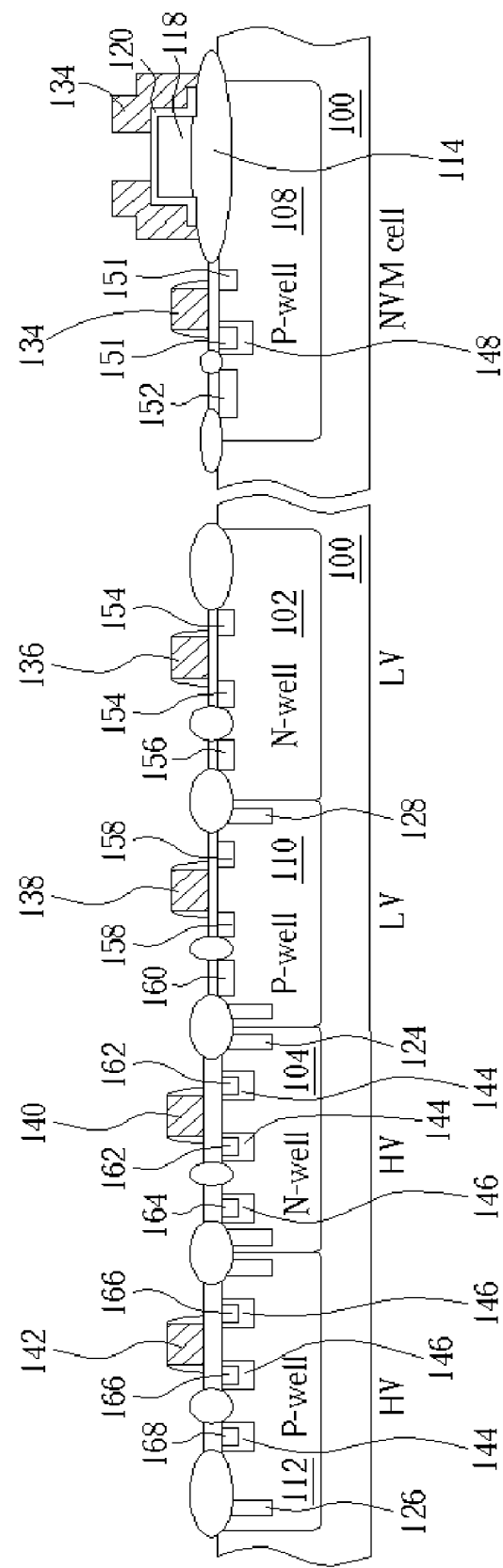

As shown in FIG. 19, a doping process is performed to form a plurality of doping regions. For example, an N-type doping region 151 and a P-type doping region 152 are formed in the NVM cell region. A P-type doping region 154, an N-type doping region 156, an N-type doping region 158, and a P-type doping region 160 are formed in the LV region. A P-type doping region 162, an N-type doping region 164, an N-type doping region 166, and a P-type doping region 168 are formed in the HV region. Subsequently, an annealing process is performed to drive-in the doping regions. In a better embodiment of the present invention, the doping regions 151, 154, 158, 162, and 166 are used as source and drains, and the doping regions 152, 156, 160, 164, and 168 are used to adjust the concentration of the wells 108, 102, 110, 104, and 112. In addition, depending on the circuit design, the LV region and the NVM cell region may be further doped to form lightly doped drains (LDD) or pocket doping regions therein.

Figure 20:
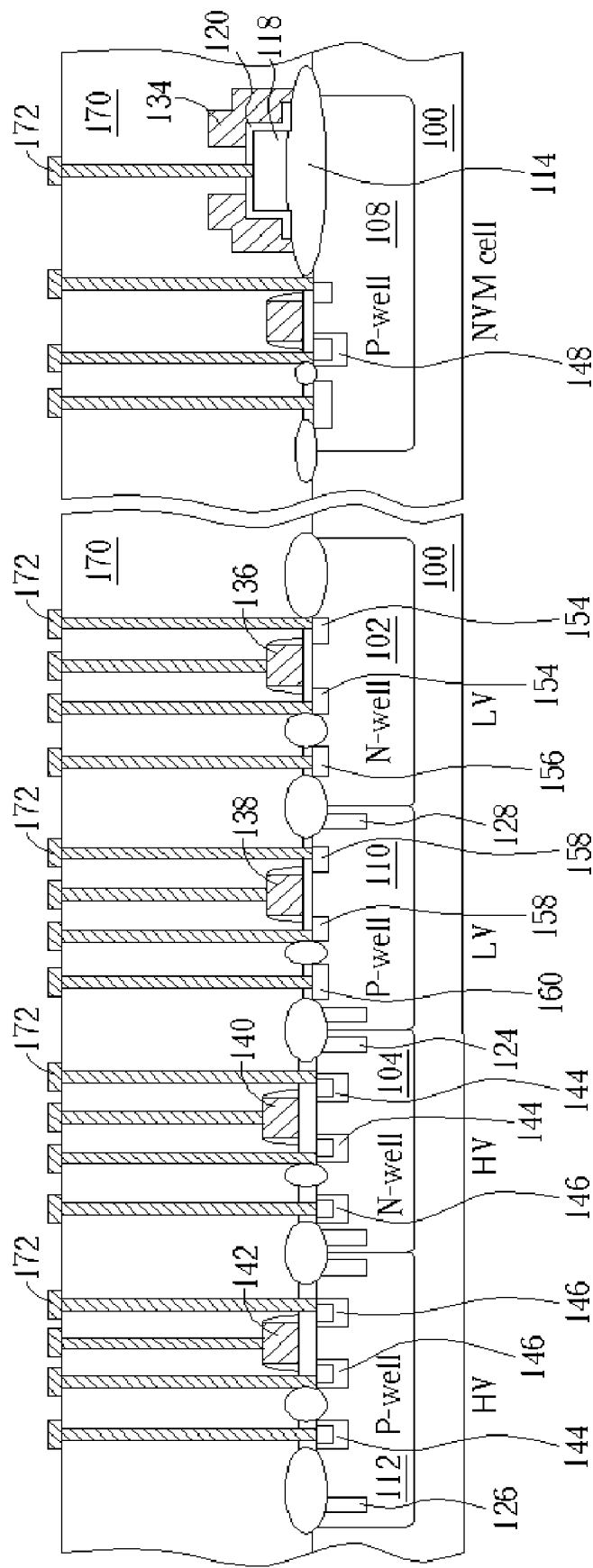

Finally, as shown in FIG. 20, an inter-layer dielectric (ILD) layer 170 is deposited on the entire substrate 100 and a plurality of contact holes are formed in the ILD layer 170, thus providing a plurality of wires 172 to connect to the gates, sources and drains of the HV MOS transistor, the LV MOS transistor, and NVM cell, respectively.

Figure 21:
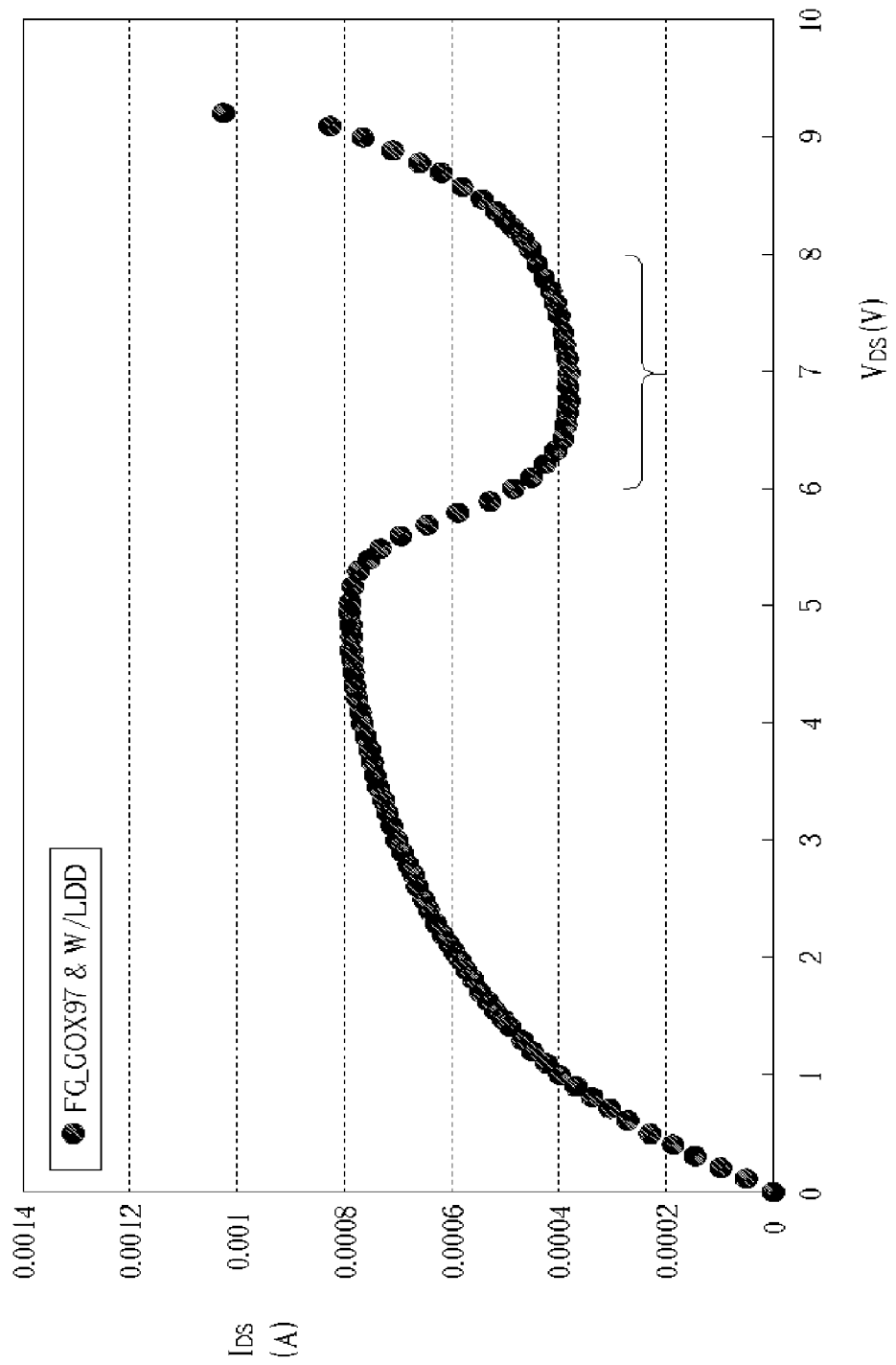
FIG. 21 is a current-voltage curve of an NVM cell according to the present invention.
Figure 22:
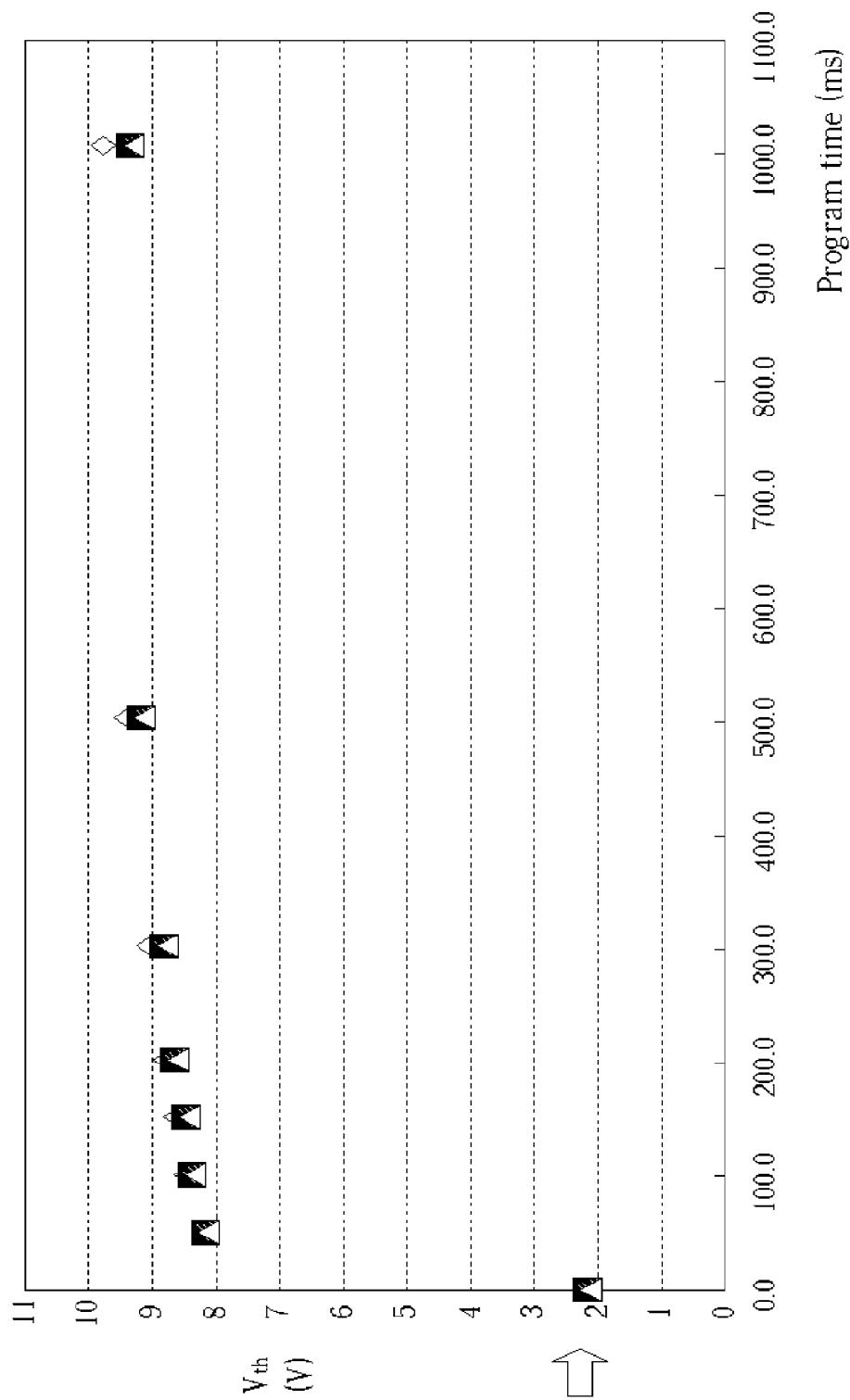
FIG. 22 is a schematic diagram illustrating a programming speed test result of an NVM dell according to the present invention.
Figure 23:
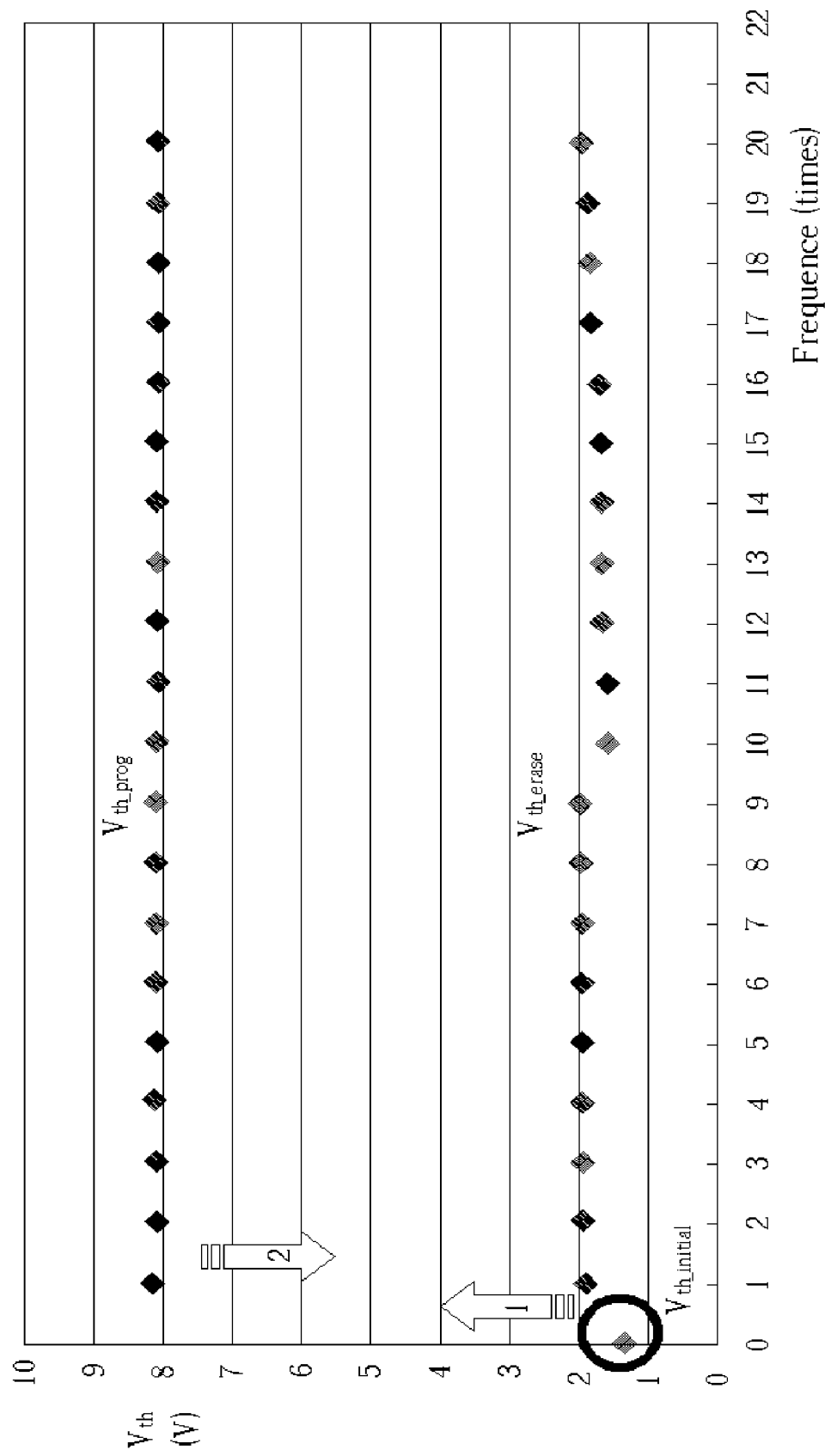
FIG. 23 is a schematic diagram illustrating an endurance test result of an NVM cell according to the present invention.

Referring to FIGS. 21-23, which illustrates test results in electrical characteristics of an NVM cell according to the present invention. FIG. 21 is a current-voltage curve of an NVM cell, and a positive voltage of 9V is supplied on a control gate of the NVM cell. As illustrated by the curve in FIG. 21, the current $I_{DS}$ flowing through the drain decreases when the voltage $V_{DS}$ supplied on the drain increases from 6V to 8V. The decrease in the current $I_{DS}$ represents that parts of the channel hot electrons are injected into a floating gate of the NVM cell. Therefore, when programming the NVM cell, a voltage ranging between 6V and 8V is preferred to supply on the drain to achieve a better programming efficiency. FIG. 22 is a schematic diagram illustrating a programming speed test result of an NVM dell, and a positive voltage of 12V is supplied on a control gate of the NVM cell. As shown in FIG. 22, when programming the NVM cell, a short time period less than 100 ms is required to change a threshold voltage of the NVM cell to 7~9 volts. FIG. 23 is a schematic diagram illustrating an endurance test result of an NVM cell according to the present invention. In the endurance test, a positive voltage of 12V is supplied on a control gate to program the NVM cell, and a programming time period is about 50 ms. In addition, a positive voltage of 9.5V is supplied on a source to erase the NVM cell, and an erasing time period is about 1000 ms. As shown in FIG. 23, when applying the NVM in an OTP memory cell or an EEPROM cell, a threshold voltage $V_{th\_prog}$ of the NVM cell maintains 7~9 volts, and a threshold voltage $V_{th\_erase}$ of the NVM cell maintains 1~2 volts after programming and erasing the NVM cell for over twenty times, thus it is capable of providing good endurance.

In contrast to the prior art, the present invention positions the floating gate above the control gate, so that the control gate is complete followed by combining the manufacturing processes for forming the tunneling oxide layer, the floating gate and the source/drain of the NVM cell together with the mixed signal process for forming HV MOS and LV MOS transistors. In addition, the control gate is positioned on the isolation structure according to the present invention, thus reducing the substrate leakage currents while operating the NVM cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a non-volatile memory cell, the method comprising:
   providing a substrate, the substrate comprising a first region and a second region;
   forming a plurality of isolation structures on the substrate, the isolation structures comprising a first isolation structure positioned in the first region and a second isolation structure surrounding the second region;
   forming a control gate on the first isolation structure in the first region;
   forming a first insulating layer on the control gate;
   forming a second insulating layer on the portion of the substrate in the second region; and
   forming a floating gate on the first insulating layer and the second insulating layer comprising forming a doped polysilicon layer on the substrate, removing a portion of the doped polysilicon layer, and remaining a portion of the doped polysilicon layer on the first insulating layer and the second insulating layer to be the floating gate, wherein an opening is formed above the first insulating layer after removing the portion of doped polysilicon layer, the opening being used to form a wire therein to connect to the control gate.

2. The method of claim 1, wherein the method of forming the floating gate further comprises remaining a portion of the doped polysilicon layer in a high-voltage region to form at least a gate of an HV MOS transistor.

3. The method of claim 2, wherein before forming the floating gate, the method further comprises forming a gate oxide layer with a thickness ranging between 450 and 550 angstroms in the high-voltage region.

4. The method of claim 2, wherein the method of forming the floating gate farther comprises remaining a portion of the doped polysilicon layer in a low-voltage region to form at least a gate of an LV MOS transistor.

5. The method of claim 4, wherein before forming the floating gate, the method farther comprises forming a gate oxide layer with a thickness ranging between 60 and 70 angstroms in the low-voltage region.

6. The method of claim 4, wherein after forming the floating gate, the gate of the HV MOS transistor, and the gate of the LV MOS transistor, the method further comprises the following steps:

forming a plurality of double diffused drains in the high-voltage region;

forming a spacer on either side of the gate of the HV MOS transistor, the gate of the LV MOS transistor, and the portion of the floating gate on the second insulating layer;

forming a plurality of doping regions in the high-voltage region, the low-voltage region, and the second region;

forming an inter-layer-dielectric layer on the entire substrate;

forming a plurality of contact holes in the inter-layer-dielectric layer to connect to the doping regions, the gate of the HV MOS transistor, the gate of the LV MOS transistor, and the control gate, respectively; and forming a plurality of wires in the contact holes.

7. The method of claim 1, wherein the isolation structures comprise field oxide layers or shallow trench isolation structures.

8. The method of claim 1, wherein the first insulating layer comprises a composite layer composed of an oxide layer, a silicon nitride layer, and a silicon oxide layer.

9. The method of claim 1, wherein the second insulating layer comprises a tunneling oxide layer.

10. The method of claim 1, wherein the portion of the floating gate positioned in the first region is stacked above the control gate.

* * * * *